United States Patent
Kobayashi et al.

[11] Patent Number: 5,804,868
[45] Date of Patent: Sep. 8, 1998

[54] SEMICONDUCTOR DEVICE HAVING PLANAR JUNCTION

[75] Inventors: Hideo Kobayashi; Mutsuhiro Mori; Yasumichi Yasuda; Yasunori Nakano, all of Hitachi, Japan

[73] Assignee: Hitachi, Ltd., Tokyo, Japan

[21] Appl. No.: 600,459

[22] Filed: Feb. 13, 1996

Related U.S. Application Data

[63] Continuation of Ser. No. 120,526, Sep. 14, 1993, abandoned.

[30] Foreign Application Priority Data

Sep. 17, 1992 [JP] Japan ................................ 4-247547

[51] Int. Cl.⁶ ................................................ H01L 23/58
[52] U.S. Cl. .............................................. 257/630
[58] Field of Search ........................................ 257/630

[56] References Cited

U.S. PATENT DOCUMENTS

| | | | |
|---|---|---|---|
| 3,763,406 | 10/1973 | Bosselaar | 257/630 |
| 4,801,995 | 1/1989 | Iwanishi | 257/630 |

FOREIGN PATENT DOCUMENTS

| | | |
|---|---|---|
| 0061551 | 12/1981 | European Pat. Off. . |
| 0115093 | 11/1983 | European Pat. Off. . |
| 0347479 | 6/1988 | European Pat. Off. . |
| 0436171 | 12/1990 | European Pat. Off. . |
| 52-27032 | 7/1977 | Japan . |
| 55-21339 | 5/1980 | Japan . |
| 61-135158 | 6/1986 | Japan . |
| 3-58185 | 9/1991 | Japan . |
| 2027992 | 8/1979 | United Kingdom . |

*Primary Examiner*—Stephen Meier
*Attorney, Agent, or Firm*—Antonelli, Terry, Stout & Kraus, LLP

[57] ABSTRACT

A highly reliable semiconductor device having a planar junction, which comprises a main junction and a plurality of field limiting ring regions surrounding the main junction, and an electrically floating conductive layer to completely cover that part of the surface of an $n^-$ layer between the main junction and the nearest field limiting ring region thereto through an insulating layer to suppress influences by external factors such as charged particles, etc. In accordance with such a structured device, when a voltage for making the main junction into a reverse bias state is applied, the potential of the conductive layer becomes fixed to an intermediate potential between the main junction and the nearest field limiting ring region thereto and plays a role of shield effect. In fact, even if the device is incorporated into a resin-sealed package and subjected to reliability tests (high temperature DC reverse bias tests), the breakdown voltage is not changed at all. Also, rather than effecting a device in which the conductive layer is electrically floating, the conductive layer which covers an overlying area between the main junction and the nearest field limiting ring region thereto can be electrically connected to the nearest field limiting ring.

7 Claims, 7 Drawing Sheets

PLAN

FIG. 5B

CROSS-SECTION
ALONG A-A

BEFORE DC REVERSE BIAS

FIG. 7B

AFTER DC REVERSE BIAS TEST

SEMICONDUCTOR DEVICE HAVING PLANAR JUNCTION

This is a continuation of application Ser. No. 08/120,526, filed Sep. 14, 1993, now abandoned.

BACKGROUND OF THE INVENTION

1) Field of the Invention

The present invention relates to a semiconductor device and, more particularly, to a semiconductor device with a planar junction having highly reliable reverse breakdown characteristics.

2) Related Prior Art

Development of semiconductor devices having a higher reverse breakdown voltage has been desired due to a demand for larger capacity for inverter apparatuses, etc. Generally, the reverse breakdown voltage of a semiconductor device depends substantially upon the pn junction-terminating region, and production of semiconductor devices with a higher breakdown voltage depends on a termination technique to uniformly weaken the electric field in this region. Heretofore mesa type semiconductor devices have been usually employed as a termination technique for higher breakdown voltage. However, production of the mesa type semiconductor devices requires complicated steps such as bevel formation, resin coating onto the bevel regions, etc. and also requires a large area for the bevel regions, and thus is not suitable for mass production. Recently, relatively small semiconductor devices of chip size with pn junction terminals of planar type, that is, the so called planar type semiconductor devices, have been employed. The planar type semiconductor device is designed to distribute an electric field applied to the main junction in the planar direction, thereby relaxing a local electric field concentration. For this purpose, a procedure for providing a plurality of field limiting ring regions to surround the main junction has been found suitable for mass production because of simple production steps and has been widely applied to devices having a relative low breakdown voltage. When the distances between the field limiting ring regions are so set that the electric field may not be unevenly distributed, there is a possibility to obtain devices of stable, high breakdown voltage characteristic.

The case of providing field limiting ring regions has the following problems and stable, high breakdown voltage characteristics have not been attainable so far. A first problem is occurrence of uneven distribution of an electric field in close proximity to the interface due to influences of fixed charge, etc. at the interface between the silicon substrate and the silicon oxide layer, and the degree of distribution fluctuates due to production factors. Relatively stable, high breakdown voltage can be obtained only as the initial characteristics by an improved technique of forming a better silicon oxide layer or by stabilization of the interface by hydrogen treatment. A second problem is a decrease in the breakdown voltage in a reliability test, typically a high temperature DC reverse bias test. Its cause seems to be due to influences of charged particles introduced therein or attached thereto from the outside of semiconductor devices. Generally, semiconductor devices of high breakdown voltage are employed after having been sealed with a synthetic resin such as a silicon-gel, etc. to prevent electric discharge or introduction of moisture, and in case of synthetic resin sealing the decrease in the breakdown voltage is very remarkable. The higher the resistivity of a silicon substrate, that is, the higher the breakdown voltage of a planar type semiconductor device, the more remarkable is the occurrence of such a phenomenon. Thus, it has been the important task in practical applications of planar type semiconductor devices of high breakdown voltage to solve these problems.

For example, a structure is proposed to meet this task in JP-B-52-27032, where the main junction is connected to the field limiting ring region by a conductive layer having a high resistivity and a shunt current is passed through the conductive layer on the basis of the reverse breakdown voltage and equalizing the surface potential distribution in the termination region to stabilize the semiconductor surface. Decrease in the breakdown voltage in the high temperature, reverse bias test can be prevented with this structure.

The conduction layer of the above-mentioned prior art requires a resistivity as high as about $10^7$ to about $10^{10} \Omega$, and usually an oxygen-doped or nitrogen-doped polysilicon layer is used as the layer of high resistivity, but is not suitable for the mass production due to very difficult control of the resistivity. Furthermore, since the shunt current is passed on the basis of the reverse breakdown voltage, the conductive layer of the prior art has a problem such as, essentially, a large reverse breakdown current and such unstable factors that the current level depends also upon the resistivity of the conductive layer, and so forth.

SUMMARY OF THE INVENTION

An object of the present invention is to provide a semiconductor device having a highly reliable planar junction of high breakdown voltage, where influences by external factors such as charged particles, etc. are suppressed by a simple means.

The present semiconductor device for attaining the above-mentioned object is characterized in that the semiconductor device comprises a main junction exposed to the principal surface of a semiconductor substrate, a plurality of field limiting ring regions surrounding the main junction, and a means for suppressing a decrease in the reverse breakdown voltage provided between the main junction and the nearest field limiting ring region to the main junction.

The means for suppressing a decrease in the reverse breakdown voltage includes (1) making the distance (e.g., minimum distance) between the main junction and the nearest field limiting ring region to the main junction smaller than the distance between the adjacent field limiting ring regions, (2) providing a conduction layer in an electrically floating state between the main junction and the nearest field limiting ring region to the main junction through an insulating layer, (3) providing a region having the same conductive type as that of the substrate and having a higher impurity concentration than that of the substrate on the surface of the semiconductor substrate between the main junction and the nearest field limiting ring region to the main junction, (4) making the distance between the main junction and the nearest field limiting ring region to the main junction smaller inside the semiconductor substrate than that on the principal surface of the semiconductor substrate, (5) covering the surface of the semiconductor substrate between the main junction and the nearest field limiting ring region to the main junction with a conductive layer through an insulating layer and electrically connecting the conductive layer to the nearest field limiting ring region to the main junction, or similar means to those mentioned above.

DETAILED DESCRIPTION OF THE INVENTION

According to the present invention, the above-mentioned object can be attained by providing a means for suppressing a decrease in the reverse breakdown voltage between the main junction and the nearest field limiting ring region to the main junction. This means will be explained in detail below.

In order to investigate causes for a decrease in the breakdown voltage of semiconductor devices having a planar junction, the present inventors have conducted tests and have clarified their detailed mechanism.

Figure 5A:
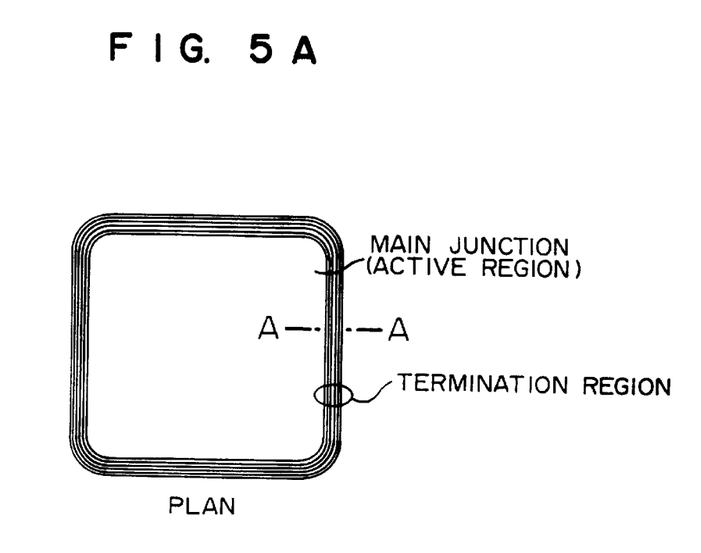
FIGS. 5A and 5B are an entire plan view and a cross-sectional view of the termination region of a pn diode prepared for investigating causes for a decrease in the breakdown voltage of a planar type, semiconductor device, respectively.
Figure 5B:
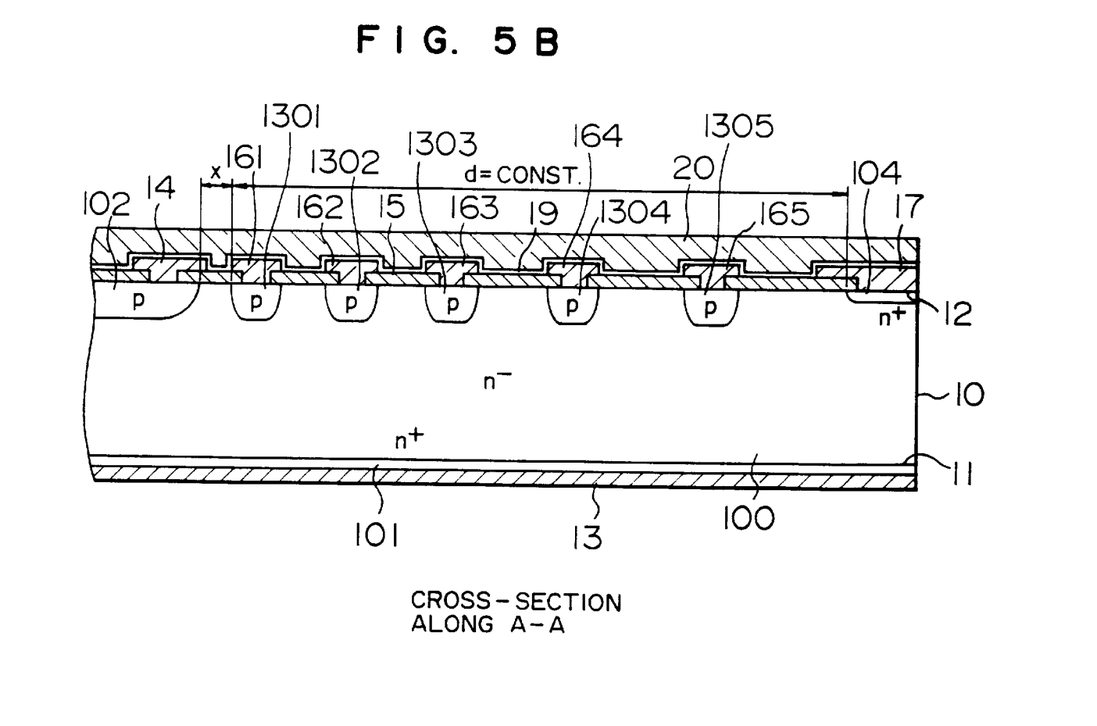

FIGS. 5A and 5B are an entire plan view of a pn diode prepared for the tests and a cross-sectional view along the line A—A of the termination region thereof, respectively.

A semiconductor substrate 10 having a pair of principal surfaces 11 and 12 comprises an $n^+$ cathode layer 101 of a higher impurity concentration, provided in contact with the principal surface 11, an $n^-$ layer 100 having a higher resistivity than that of the $n^+$ layer 101, provided in contact with the $n^+$ layer 101 and the other principal surface 12, a p-type anode layer 102 having a higher impurity concentration than that of the $n^-$ layer 100 and extending from the other principal surface 12 into the $n^-$ layer 100 and forming a main junction of planar type terminating on the other principal surface 12 between the p-type anode layer 102 and the $n^-$ layer 100, a plurality of field limiting ring regions 1301–1305 of p-type having a higher impurity concentration than that of the $n^-$ layer 100 and surrounding the p-type anode layer 102, provided at distances far from the p-type anode layer 102, and a n-type guard ring region 104 having a higher impurity concentration than that of the $n^-$ layer 100, extending from the other principal surface 12 into the $n^-$ layer 100, provided at the periphery of the other principal surface 12. A cathode electrode 13 is provided in ohmic contact with the $n^+$ cathode layer 101, an anode electrode 14 having a field plate function is provided in ohmic contact with the p-type anode layer 102, insulating layers 15 each composed of a lower layer of silicon oxide ($SiO_2$) and an upper layer of phosphosilicate glass (PSG) are provided to cover the other principal surface 12 of the semiconductor substrate 10, field plates 161–165 are provided in contact with the field limiting ring regions 1301–1305, a field plate 17 is provided in contact with the guard ring region 104, a PSG layer 19 is provided to cover the exposed surfaces of the anode electrode 14, the insulating layers 15 and field plates 161–165 and 17, and a polyimide layer 20 is provided to cover the PSG layer 19. The distances from the main junction to the individual field limiting ring regions are so set that the electric fields generated below the insulating layers can be substantially equalized.

Figure 6:
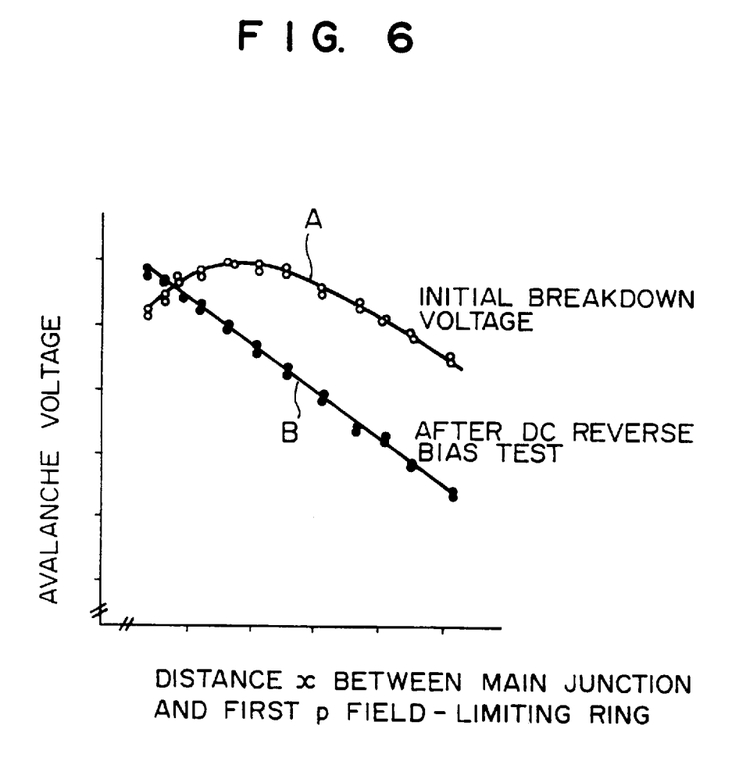
FIG. 6 is a diagram showing results of evaluation of reverse breakdown voltages before and after high temperature, DC reverse bias tests of pn diodes with various distances between the main junction and the nearest field limiting ring region thereto as a parameter.

Diodes, in which the distance x between the right end of the main junction and the left end of the field limiting ring region 1301 was changed to various degrees, while making the distance d between the left end of the field limiting ring region 1301 and the left end of the guard ring region 104 constant, were prepared and incorporated into the respective ceramic packages sealed with silicone gel to measure their reverse breakdown voltages before and after a high temperature DC reverse bias test. Results are shown in FIG. 6, where the curve A shows initial breakdown voltages of diodes before the high temperature DC reverse bias test, and the larger the distance x, the higher the electric field in close proximity to the surface at the right end of the main junction, at which an avalanche breakdown takes place, resulting in a decrease in the breakdown voltage. When the distance x is too small, on the other hand, a voltage load on the field limiting ring regions 1302–1305 existing at the outside of the field limiting ring region 1301 is larger, and thus concentration of the electric field takes place at the right end of any of the field limiting ring regions 1301–1305, resulting in a decrease in the breakdown voltage. That is, there is an optimum distance x at which the highest breakdown voltage is obtainable.

Figure 7A:
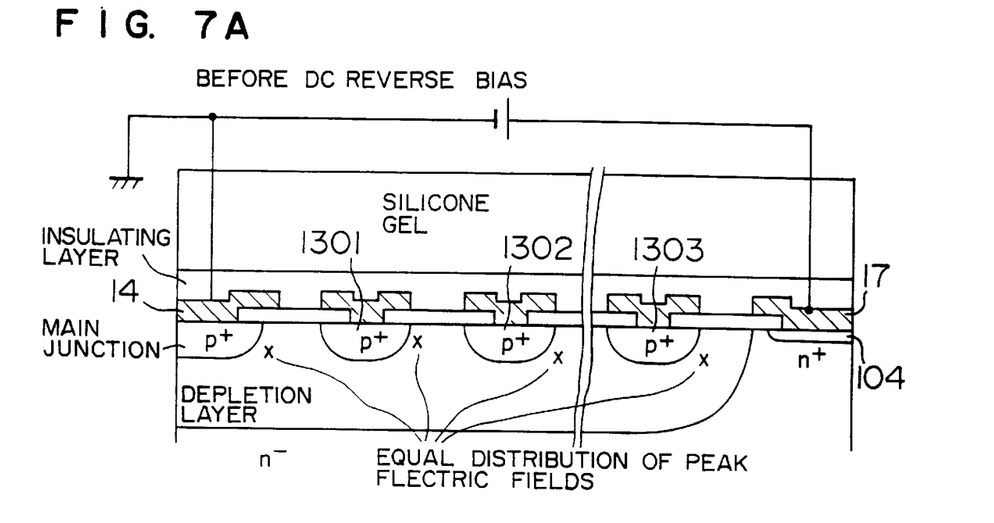
FIGS. 7A and 7B are diagrams illustrating a mechanism of changes in the breakdown voltage before and after high temperature, DC reverse bias tests, respectively.
Figure 7B:
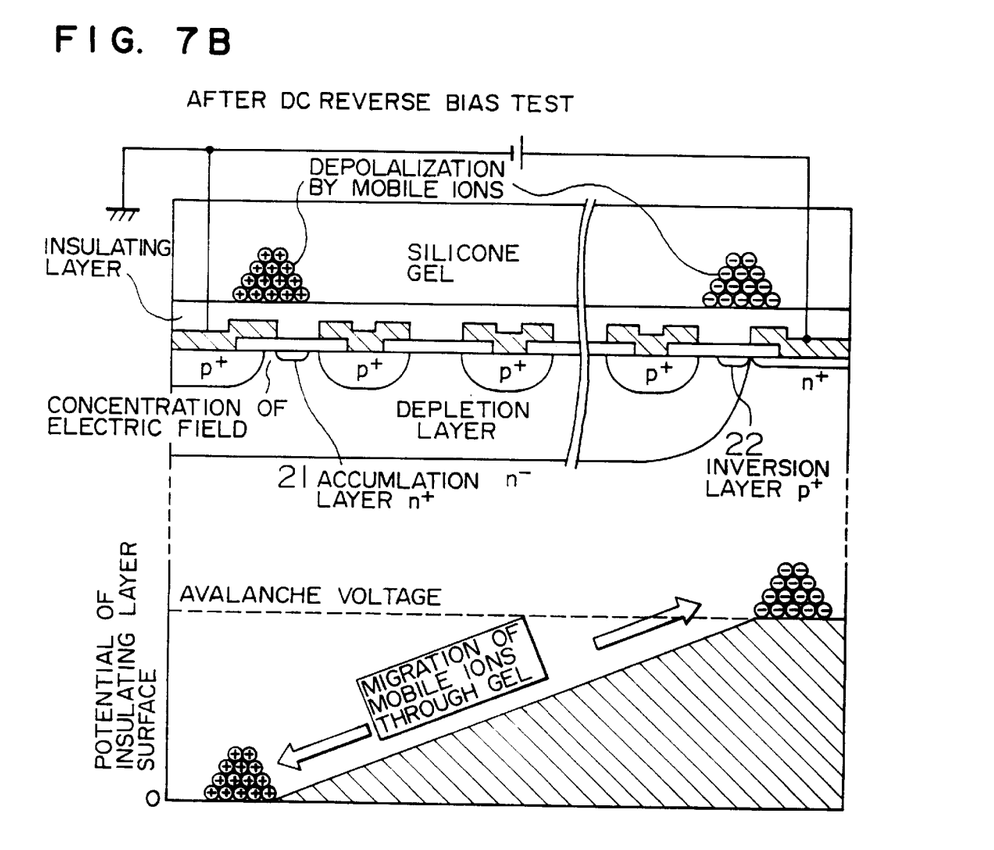

On the other hand, line B shows breakdown voltage measurements after the high temperature, DC reverse bias test (application of reverse bias of 80% initial breakdown voltage peak at 125° C. for 1,000 hours) where the smaller the distance x, the higher the breakdown voltage, and there is a zone intersecting the initial breakdown voltage curve A. Usually, the diodes are so designed as to obtain the highest initial breakdown voltage, and thus the breakdown voltage is decreased after the high temperature, DC reverse bias test. However, such a very interesting fact has been found that there is a point at which the breakdown voltage after the high temperature, DC reverse bias test is not changed from the initial breakdown voltage or larger than the initial breakdown voltage. As a result of a study of causes for this fact, it has been found that the phenomena of the decrease in the breakdown voltage after the high temperature, DC reverse bias test appear on the bias of mechanism shown in FIGS. 7A and 7B. The mechanism is as follows:

As shown in FIG. 7A, peak electric fields generated at the ends of the individual field limiting ring regions are substantially equally distributed before the test because the distances between the adjacent regions are so set that no uneven distribution of electric fields may take place, but mobile ions in the silicone gel travel by a potential on the surface of the insulating layer, thereby occasioning polarization. Plus (+) ions are moved to the end of the main junction at the lowest potential, and an accumulation layer 21 is formed on the surface of $n^-$ layer 100 between the main junction and the field limiting ring region 1301 due to the generated charge. Thus, the depletion layer is hard to extend (which is equivalent to substantial a extension of the distance x between the main junction and the field limiting ring region 1301), and thus the electric fields are concentrated on the end of the main junction, resulting in a decrease in the breakdown voltage (FIG. 7B).

When the distance x is smaller than the optimum distance as to the initial breakdown voltage, on the other hand, the initial electric field at the end of the main junction is weak enough to balance with intensification of the electric field in that place due to the influence of plus (+) ions by the depolarization, and thus the concentration of electric fields can be relaxed. As a result, the breakdown voltage is not changed or becomes larger after the test. Minus (−) ions are gathered at the end of the guard ring region 104 and it seems that a p inversion layer 22 is formed on the surface of the $n^-$ layer 100 in close proximity to the end of the guard ring region 104, but makes it easy to extend the depletion layer in close proximity to the guard ring region 104 without any substantial influence upon changes in the breakdown voltage.

The present invention has been established on the basis of the foregoing test results. Changes in the breakdown voltage are due to gathering of the mobile ions in the silicone gel at the end of the main junction. Since it is impossible to completely remove the mobile ions from the synthetic resin such as silicone gel, etc., it is necessary in preparation of highly reliable semiconductor devices to reduce such influences or for that matter, remove them completely. The present invention is directed towards achieving such a result. Changes in the breakdown voltage in the high temperature, DC reverse bias test depend only upon the distance between the main junction and the nearest field limiting ring region to the main junction. Thus, the present invention provides a means for suppressing a decrease in the breakdown voltage between the main junction and the nearest field limiting ring region to the main junction. As shown in FIG. 6, it is one of the effective means to make the distance between the main junction and the nearest field limiting ring region to the main junction approach such a distance at which an equal breakdown voltage after the high temperature, DC reverse bias test to the initial breakdown voltage can be obtained. Highly reliable semiconductor devices of planar junction can be obtained by this very simple means.

It is not preferable to narrow the other distances between the adjacent field limiting ring regions than that between the main junction and the nearest field limiting ring region to the main junction, because the narrowing gives rise to uneven distribution of the electric fields. In order to narrow the distances between the adjacent field limiting ring regions without any uneven distribution of electric fields, all the distances between the adjacent field limiting ring regions must be evenly narrowed and also the number of the field limiting ring regions must be increased. This leads to an increase in the area of termination region, resulting in an increase in the chip area and a decrease in the production yield. Thus, it is only desirable to narrow the distance between the main junction and the nearest field limiting ring region to the main junction rather than the distances between the adjacent field limiting ring regions.

PREFERRED EMBODIMENTS OF THE INVENTION

The present invention will be described in detail below, referring to drawings illustrating the embodiments of the present invention.

Figure 1:
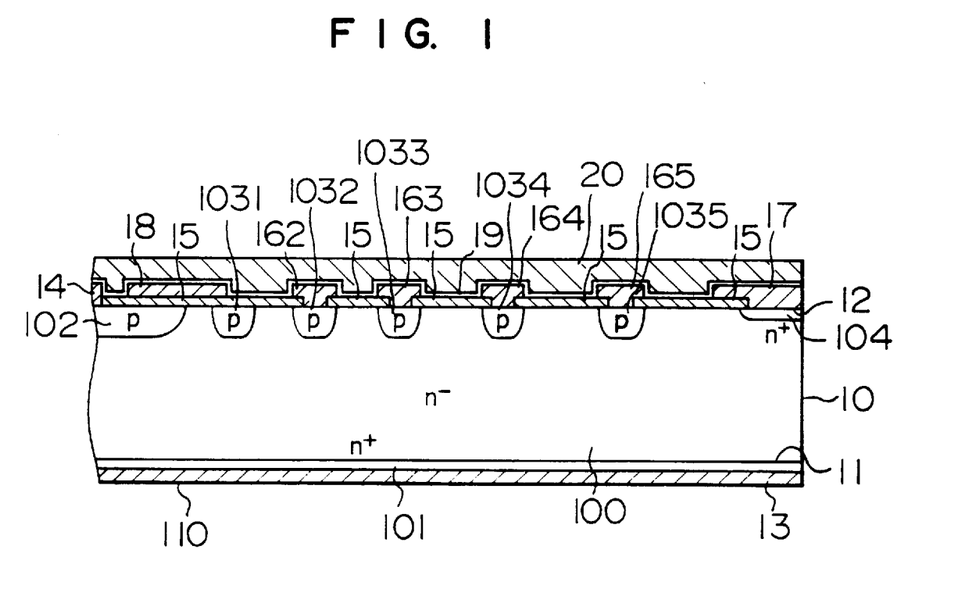
FIG. 1 is a schematic cross-sectional view showing a termination area of a diode according to one embodiment of the present invention.

FIG. 1 is a cross-sectional view showing the termination region of a pn diode according to one embodiment of the present invention, where a semiconductor 10 having a pair of principal surfaces 11 and 12 comprises an $n^+$ cathode layer 101 having a high impurity concentration, provided in contact with the principal surface 11, an $n^-$ layer 100 in contact with the $n^+$ layer 101 and the other principal surface 12 and having a higher resistivity than that of the $n^+$ layer 101, a p-type anode layer 102 extending from the other principal surface 12 into the $n^-$ layer 100 and forming a main junction of planar type terminating on the other principal surface 12 between the $n^-$ layer 100 and the p-type anode layer 102, and having a higher impurity concentration than that of the $n^-$ layer 100, a plurality of p-type field limiting ring regions 1031–1035, extending from the other principal surface 12 into the $n^-$ layer 100, surrounding the p-type anode layer 102 at distances far from the p-type anode 102 and having a higher impurity concentration than that of the $n^-$ layer 100, and an n-type guard ring region extending from the other principal surface 12 into the $n^-$ layer 100 at the periphery of the other principal surface 12 and having a higher impurity concentration than that of the $n^-$ layer 100. A cathode electrode 13 is provided in ohmic contact with the $n^+$ cathode layer 101 on the principal surface 11 of the semiconductor substrate 10, an anode electrode 14 composed of Al.Si is provided in ohmic contact with the p-type anode layer 102 on the other principal surface 12 of the semiconductor substrate 10, insulating layers 15, each comprising a silicon oxide ($SiO_2$) layer as a lower layer and a phosphosilicate glass (PSG) layer as an upper layer are provided to cover the regions with no formation of anode electrode on the other principal surface 12 of the semiconductor substrate 10, field plates 162–165, composed of Al.Si, each of whose ends extends over the boundary between the respective field limiting ring regions and the $n^-$ layer 100 over the insulating layer 15 are provided in contact with other field limiting ring regions 1032–1035 than the nearest one to the p-type anode layer 102, another field plate 17, composed of Al.Si, whose end extends over the boundary between the guard ring region 104 and the $n^-$ layer 100 over the insulating layer 15 is provided in contact with the guard ring region 104, an electrically floating conductive layer 18, composed of Si-Al, extending from the p-type anode layer 102 to the nearest field limiting ring region 1031 thereto is provided on the insulating layer 15, a PSG layer 19 is provided to cover exposed parts of the anode electrode 14, the insulating layers 15, the field plates 162–165 and 17 and the conduction layer 15, and a polyimide layer 20 is provided to cover the PSG layer 19.

When a polarity of making the main junction take a reverse bias (a higher potential at the cathode electrode 13 than at the anode electrode 14) is applied between the anode electrode 14 and the cathode electrode 13 in the pn diode with the above-mentioned structure, the potential of the conductive layer 18 is fixed to an intermediate potential between the main junction and the nearest field limiting ring region 1031 thereto to play a role of shield effect, and thus the pn diode has no influences by external factors such as mobile ions, etc. at all. Thus, no changes occur at all in the breakdown voltage before and after the high temperature, DC bias test of resin-sealed diode devices, and thus very reliable planar type diodes of high breakdown voltage can be produced. Since the conductive layer 18 in an electrically floating state can be formed from the common material (Al.Si) by the common steps to for that formation of the field plates 162–165 or formed from polycrystalline silicon, usually used in the semiconductor production technique, the conductive layer can be produced by very simple means and thus is suitable for effective mass production.

It is preferable to provide the conduction layer 18 only between the main junction and the nearest field limiting ring region 1031 thereto, as mentioned above. Since the conductive layer 18 is partially at a higher potential than that on the surface of the n⁻ layer 100 just below the conductive layer 18, there may be a new problem, depending upon a potential difference therebetween. When the potential difference is small, there will be no problem at all, but when the potential difference is large, hot carriers generated on the surface of the n⁻ layer are attracted to the electric field of the conductive layer 18 and are plunged into the insulating layer 15, resulting in deterioration of the insulating layer 15 with time to change the reverse breakdown voltage. When the conductive layer 18 is provided only between the main junction and the nearest field limiting ring region 1031 thereto, there will be no such new problem substantially, because of a small potential difference, but when such conductive layers are provided also between the adjacent field limiting ring region, the problem is substantial. Thus, it is preferable to provide the conductive layer at the above-mentioned position.

The embodiment of the present invention directed to a diode has been described in the foregoing, but the present invention can be applied also to other semiconductor devices than the diode. When the present invention is applied to other semiconductor devices than the diode, only the region for forming the main junction can be changed, while retaining the termination region as unchanged. For example, in case of a bipolar transistor, an n emitter layer is formed in the p-type anode layer 102, while changing the anode electrode 14 to a base electrode and the cathode electrode 13 to a collector electrode, and an emitter electrode is provided on the n emitter layer.

In case of a thyristor, an n emitter layer is formed in the p-type anode layer 102, while changing the n⁺ cathode layer to a p⁺ layer, the anode electrode 14 to a gate electrode, and the cathode electrode 13 to an anode electrode, and a cathode electrode is provided on the n emitter layer.

In case of MOSFET, an n source layer is formed in the p-type anode layer 102, a source electrode is provided on the n source layer, an insulating gate is provided from the n⁻ layer 100 to the n source layer, and the cathode electrode is changed to a drain electrode.

In case of an insulated gate bipolar transistor (IGBT), a p⁺ layer is provided between the n⁺ cathode layer and the drain electrode of the MOSFET.

Figure 2:
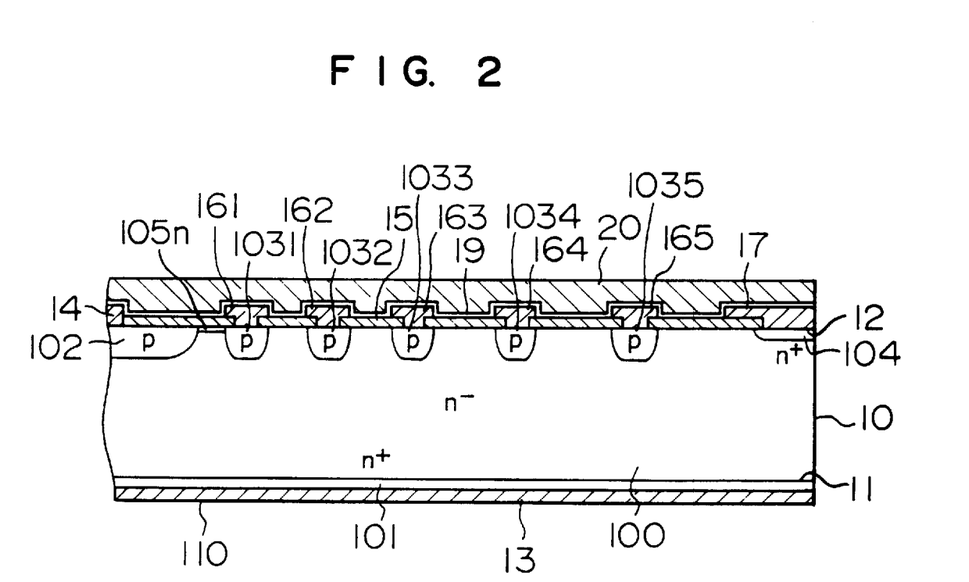
FIG. 2 is a schematic cross-sectional view showing another embodiment of the present invention.

FIG. 2 is a cross-sectional view of a termination region according to another embodiment of the present invention. Differences from the embodiment shown in FIG. 1 are that a field plate 161 is formed also in the nearest field limiting ring region 1031 to the main junction in the same manner as in other field limiting ring regions in place of the conductive layer 18, and an n layer 105 having a higher impurity concentration than that of the n⁻ layer 100 is provided on the surface of the n⁻ layer 100 between the main junction and the nearest field limiting ring region 1031 thereto. According to this structure, the n layer 105 is formed in advance in the region where an accumulation layer (high concentration of n-type impurities) is formed due to the influence of mobile ions in the n⁻ layer 100, and thus there will be no substantial influence by mobile ions. That is, the depletion layer extending from the main junction is made difficult to extend on the surface of the n layer 105 and easy to extend within the n⁻ layer 100 in advance, and thus potential transfer into the field limiting ring region 1031 is made to take place within the n⁻ layer 100 not susceptible to the influence by the accumulation layer. Thus, if the impurity concentration of the n layer 105 is too high, the initial breakdown voltage will be decreased, whereas, if it is too low, the effect of the present invention will not be obtained. It is desirable to make the concentration equal to or by about one order higher than the amount of electrons (the amount of electrons in the accumulation layer) induced on the surface of the n⁻ layer 100 by mobile ions. Since the amount of electrons in the accumulation layer has been estimated to be in the order of $10^{11}/cm^2$ by tests, it is preferably in the order of about $10^{12}/cm^2$. In order to make the depletion layer easy to extend within the n⁻ layer 100, it is preferable that the n layer 105 has as small a depth as possible. Furthermore, it is preferable to provide the n layer 105 only between the main junction and the nearest field limiting ring region 1031 thereto, as in this embodiment.

As explained above, the n layer 105 acts to suppress the extension of the depletion layer at least on the surface between the main junction and the nearest field limiting ring region 1031 thereto, (that is, to strengthen the electric field), and the degree of suppression depends upon the impurity concentration and depth of the n layer 105. Thus, it is not preferable to provide the n layer 105 at other positions than the position between the main junction and the nearest field limiting ring region 1031 thereto, because such a provision is a factor for causing fluctuations in the production steps, thereby changing the initial breakdown voltage considerably.

According to this embodiment changes in the breakdown voltage can be suppressed by a very simple means without fail, and thus highly reliable, planar type semiconductor devices of high breakdown voltage suitable for mass production can be produced.

Figure 3:
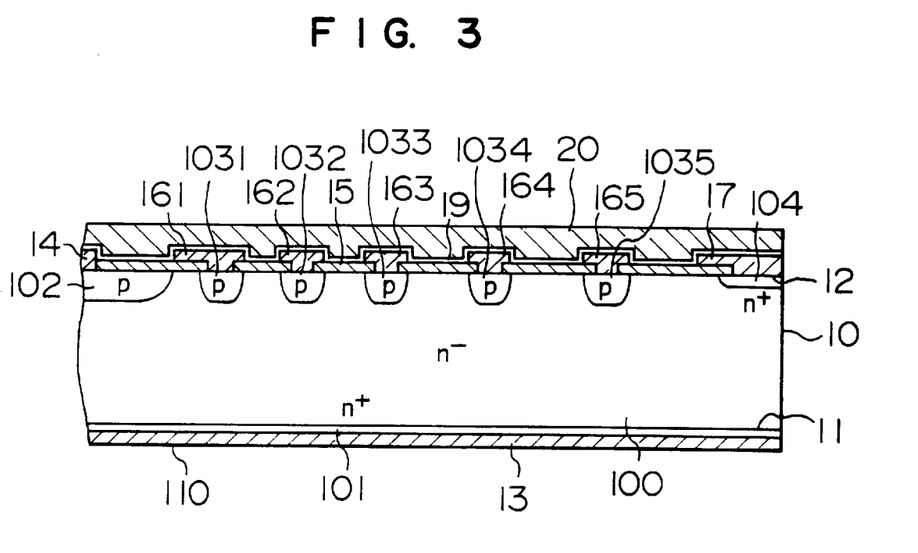
FIG. 3 is a schematic cross-sectional view showing still another embodiment of the present invention.

FIG. 3 is a cross-sectional view of a termination area according to another embodiment of the present invention. Differences from the embodiment shown in FIG. 1 are that a field plate 161 is provided in the nearest field limiting ring region 1031 to the main junction and is extended to the p-type anode layer 102 through the insulating layer 15 in place of the conductive layer 18. According to this structure, the field plate 161 is fixed to the higher potential of the field limiting ring region 1031 than that of the main junction, when the main junction is in a reverse bias state. Thus, electrons are induced to gather on the surface of the n⁺ layer 100 just below the field plate 161 to form an accumulation layer. Thus, the same effect as in the embodiment of providing the n layer 105 in advance, as shown in FIG. 2, can be obtained, and the depletion layer is easier to extend inside the n⁻ layer 100 than on the surface thereof.

It is preferable to provide the field plate 161 of this example only between the main junction and the nearest field limiting ring region 1031 thereto. As explained above, the field plate 161 has a higher potential than that on the surface of the n⁻ layer 100 just below the field plate 161, and thus there may be a new problem due to a potential difference therebetween. In case of a small potential difference there will be no problem at all, whereas in case of a larger potential difference hot carriers generated on the surface of n⁺ layer 100 are attracted to the electric field of field plate 161 and plunged into the insulating layer 15, resulting in deterioration of the insulating film 15 with time to change the reverse breakdown voltage. When the field plate 161 is provided only between the main junction and the nearest field limiting ring region thereto, there will be no problem substantially, because of a small potential difference, but when such field plates are provided between the adjacent field limiting ring regions there will be a problem. Thus, it is preferable to provide the field plate 161 only between the main junction and the nearest field limiting region 1031 thereto, as explained above. In order to make the potential difference smaller, it is preferable that the distance between the main junction and the field limiting region 1031 is as small as possible.

Figure 4:
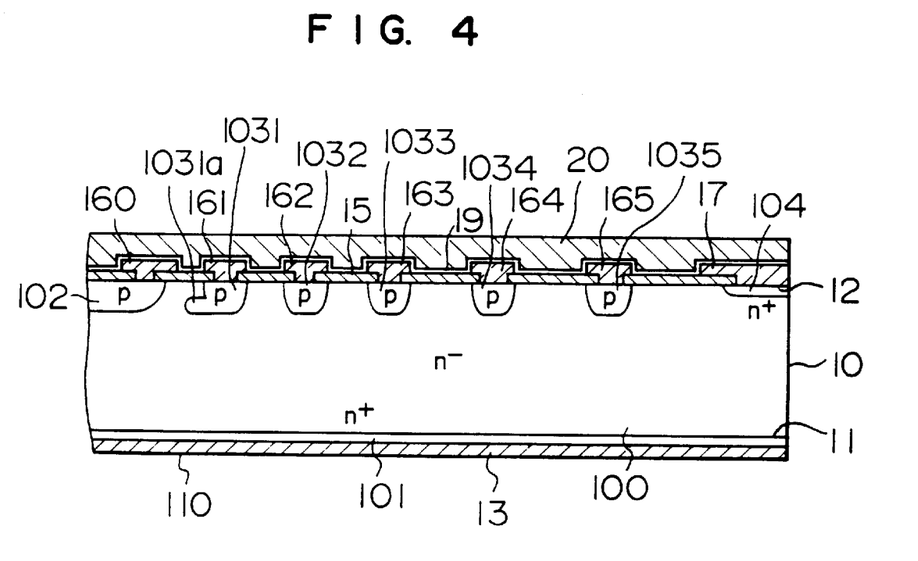
FIG. 4 is a schematic cross-sectional view showing a further embodiment of the present invention.

FIG. 4 is a cross-sectional view of a termination region according to a still further embodiment of the present invention. Differences from the embodiment of FIG. 1 are that field plates 160 and 161 are formed on the p-type anode layer 102 and the nearest field limiting ring region to the main junction, respectively, and the field limiting ring region has a projection 1031a at the bottom, protruded toward the main junction. According to this structure, the projection 1031a is formed below the region where an accumulation layer (high concentration n-type) is formed due to the influence by mobile ions, and thus the influence by mobile ions can be substantially removed. That is, when the main junction is in a reverse bias state, the depletion layer extending from the main function can readily reach the projection 1031a provided inside the n⁻ layer 100 without any influence by the surface state of the n⁻ layer 100, and thus the potential transfer into the field limiting ring region 1031 can be minimized to such a degree that the influence by an accumulation layer formed on the surface of the n⁻ layer 100 by mobile ions can be disregarded. According to the present invention, changes in the breakdown voltage can be suppressed by a simple means and thus highly reliable, planar type semiconductor devices of high breakdown voltage suitable for mass-production can be produced. In this embodiment, extension of the depletion layer can be made easier inside the n⁻ layer 100 than on the surface thereof, and thus this embodiment is the same as embodiments shown in FIGS. 2 and 3 in principle. That is, the effect of the present invention can be obtained even by a combination of these means.

Figure 8:
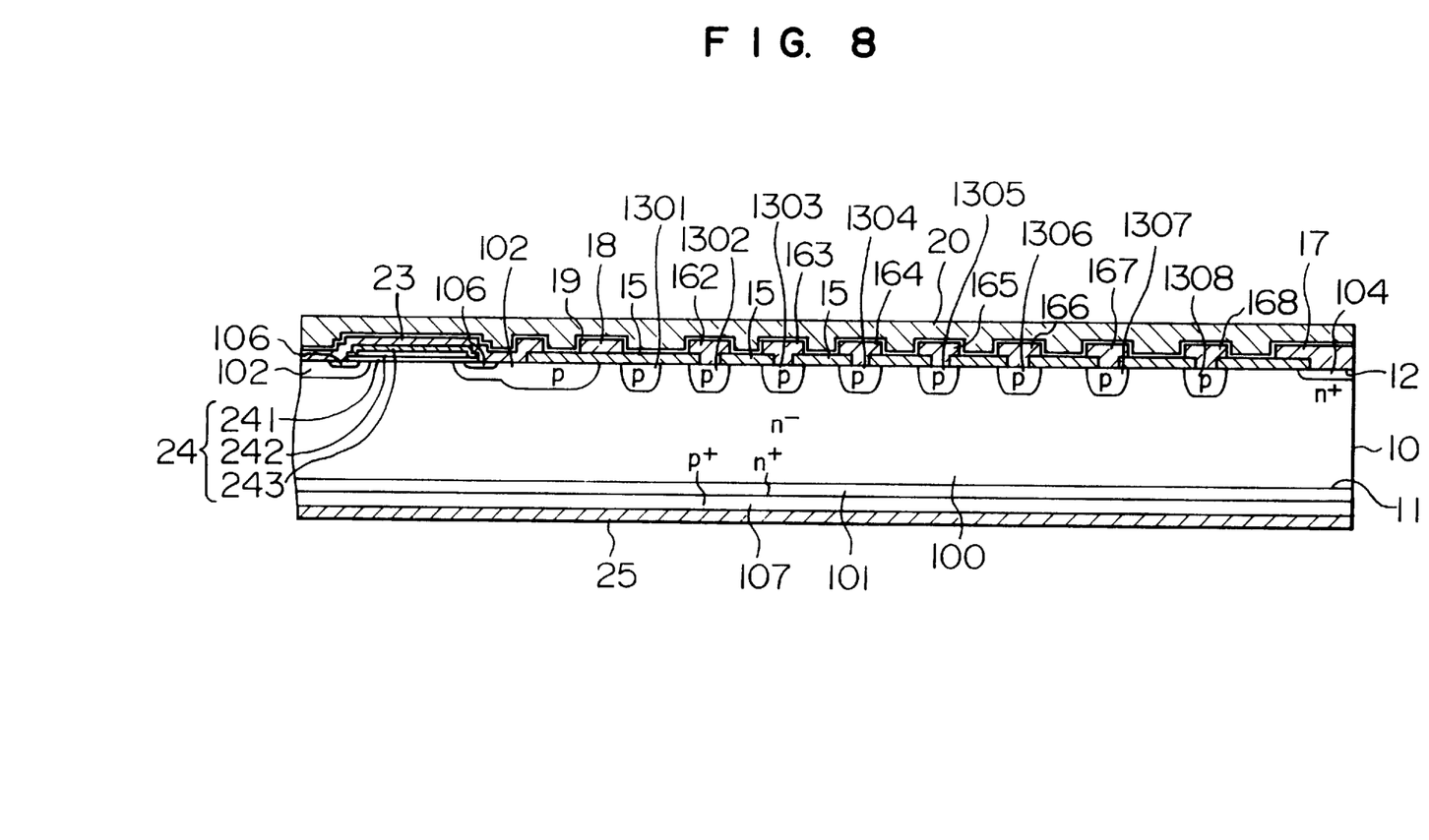
FIG. 8 is a schematic cross-sectional view showing application of the present invention to an insulated gate bipolar transistor (IGBT).

FIG. 8 is a cross-sectional view showing an application of the present invention to an insulated gate bipolar transistor (IGBT), whose structure comprises, as explained referring to FIG. 1, n source layers 106 formed in a p-type anode layer 102 of FIG. 1, a source electrode 23 provided on the n source layers 106, an insulating gate 24 extending from the n⁻ layer 100 to the n source layers provided on the n⁻ layer 100, a collector electrode changed from the cathode electrode, and a p⁺ layer 107 provided between the n⁺ cathode layer 101 and the collector electrode 25. The insulating gate comprises a gate oxide layer 241 composed of $SiO_2$, a gate electrode 242 composed of polycrystalline silicon doped with phosphorus at a high concentration and an insulating layer 243 composed of PSG, provided to cover the gate electrode 242. The source electrode 23 is in contact not only with the n source layers 106, but also with the p-type anode layer 102. When a voltage of making the main junction into a reverse bias state is applied between the source electrode 23 and the collector electrode 25 in this structure, the potential of the conductive layer 18 is fixed to an intermediate potential between the main junction and the field limiting ring region 1031 and plays a role of shield effect, and thus there are no influences by external factors such as mobile ions, etc. at all.

Figure 9:
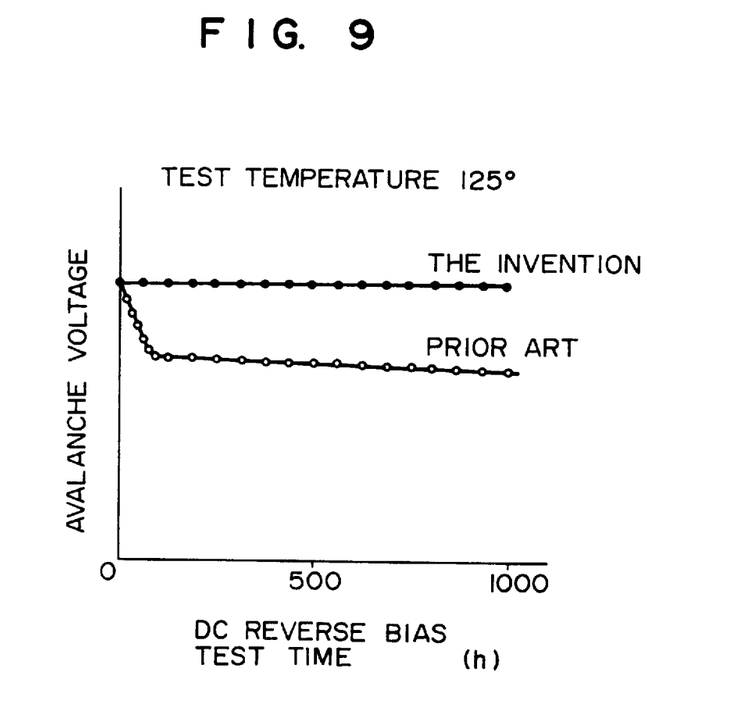
FIG. 9 is a diagram showing results of high temperature, DC reverse bias tests of IGBT of FIG. 8, incorporated in a resin-sealed package, as compared with the prior art.

FIG. 9 shows results of high temperature, DC reverse bias tests of the IGBT of FIG. 8, incorporated in a resin-sealed package, as compared with the prior art without the conductive layer 18. According to the prior art, the breakdown voltage is considerably decreased after a few ten hours, whereas according to the present invention the breakdown voltage is not changed at all even after 1,000 hours. That is, a very highly reliable IGBT of high breakdown voltage can be produced.

As explained above, a higher breakdown voltage of semiconductor devices having a planar junction can be easily attained according to the present invention, and thus a power transducer can have a higher reliability and a higher capacity.

Figure 10:
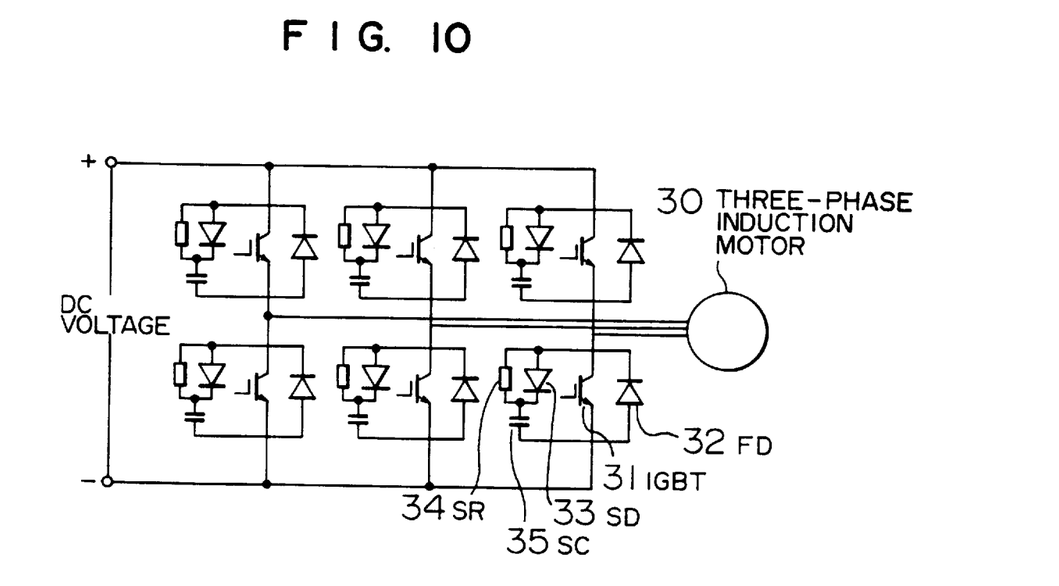
FIG. 10 is a schematic circuit diagram of an inverter apparatus for controlling an electric motor comprising IGBTs and diodes according to the present invention.

FIG. 10 shows one embodiment of the structure of an inverter apparatus for controlling an electric motor using IGBTs and diodes according to the present invention, where a voltage type inverter circuit is made with 6 IGBTs to control a three-phase induction motor 30. Its unit circuit comprises an IGBT 31, a fly-wheel diode (FD) 32, a snubber diode (SD) 33, a snubber resistor (SR) 34, and a snubber condenser (SC) 35. IGBT itself is a device with a high switching speed, and by application of the present invention thereto IGBT and likewise diodes can have a higher reverse breakdown voltage. Such IGBTs and diodes, even if used for a long time, are not susceptible to a decrease in the breakdown voltage and thus an inverter apparatus can have a larger capacity with a higher frequency and with a high reliability. Thus, the present invention is effective for smaller size, lighter weight, lower loss, lower noise, etc. of an inverter apparatus, and a lower cost and a higher efficiency of a system using an inverter system can be attained according to the present invention.

According to the present invention, a planar junction without any decrease in the reverse breakdown voltage can be obtained even if used for a long time, and a highly reliable semiconductor devices of high breakdown voltage can be readily and effectively produced.

What is claimed is:

1. A semiconductor device which comprises a semiconductor substrate, to one principal surface of which a first semiconductor region of a first conductivity type is exposed, a second semiconductor region of a second conductivity type, opposite that of said first conductivity type, being provided at said principal surface and extending therefrom into said first semiconductor region and forming a planar junction comprised of a pn junction with said first semiconductor region, and a plurality of third annular semiconductor regions of said second conductivity type being provided at said principal surface each of which is extended from said principal surface into said first semiconductor region and all of which surround said second semiconductor region and are spaced apart with respectively different distances from said second semiconductor region, wherein a minimum distance between said planar junction and the nearest third annular semiconductor region to said second semiconductor region is smaller than a minimum distance between any adjacently disposed pair of said third annular semiconductor regions, and wherein a conductive layer is provided so as to cover, through an insulating layer, a part of said first semiconductor region, the part of said first semiconductor region being covered includes the whole surface of said first semiconductor region located between the second semiconductor region and the third annular semiconductor region nearest thereto, said conductive layer does not cover, either partly or completely, the whole surface of said first semiconductor region located between any adjacently disposed pair of said third annular semiconductor regions.

2. A semiconductor device according to claim 1, wherein said conductive layer is in an electrically floating state.

3. A semiconductor device according to claim 2, wherein said first semiconductor region is a lightly doped n-type region, said second semiconductor region and said third semiconductor regions are of p-type conductivity, respectively, and each has an impurity concentration greater than that of said first semiconductor region.

4. A semiconductor device according to claim 3, wherein said conductive layer is an Al.Si layer.

5. A semiconductor device according to claim 1, wherein said conductive layer is electrically connected to the nearest third annular semiconductor region to said second semiconductor region.

6. A semiconductor device according to claim 5, wherein said first semiconductor region is a lightly doped n-type region, said second semiconductor region and said third semiconductor regions are of p-type conductivity, respectively, and each has an impurity concentration greater than that of said first semiconductor region.

7. A semiconductor device according to claim 6, wherein said conductive layer is an Al.Si layer.

* * * * *